United States Patent
Kim et al.

(10) Patent No.: US 10,103,071 B2
(45) Date of Patent: Oct. 16, 2018

(54) PATTERN INSPECTION METHODS AND METHODS OF FABRICATING RETICLES USING THE SAME VIA DIRECTING CHARGED PARTICLE BEAMS THROUGH DISCHARGE LAYERS

(71) Applicant: Samsung Electronics Co., Ltd., Suwon-si, Gyeonggi-do (KR)

(72) Inventors: Eokbong Kim, Hwaseong-si (KR); Jin sung Choi, Suwon-si (KR); Mun Ja Kim, Suwon-si (KR); Kijung Son, Hwaseong-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/609,284

(22) Filed: May 31, 2017

(65) Prior Publication Data
US 2018/0130714 A1    May 10, 2018

(30) Foreign Application Priority Data
Nov. 4, 2016 (KR) .................. 10-2016-0146376

(51) Int. Cl.
*H01L 21/66* (2006.01)
*H01L 21/027* (2006.01)
*G03F 1/62* (2012.01)

(52) U.S. Cl.
CPC ............... *H01L 22/20* (2013.01); *G03F 1/62* (2013.01); *H01L 21/0274* (2013.01)

(58) Field of Classification Search
CPC ......... H01L 22/12; H01L 22/20; H01L 22/34; H01L 23/544
See application file for complete search history.

(56) References Cited

U.S. PATENT DOCUMENTS

| | | | |
|---|---|---|---|
| 5,783,366 A | 7/1998 | Chen et al. | |
| 5,821,131 A * | 10/1998 | Bae | H01L 22/12 257/E21.53 |
| 6,774,365 B2 | 8/2004 | Okoroanyanwu et al. | |
| 7,817,844 B2 | 10/2010 | Kitamura et al. | |
| 2013/0040124 A1 | 2/2013 | Koo et al. | |
| 2013/0200501 A1 | 8/2013 | Cen et al. | |
| 2014/0073114 A1 | 3/2014 | Cen et al. | |
| 2014/0206112 A1 | 7/2014 | Montgomery et al. | |

FOREIGN PATENT DOCUMENTS

| | | |
|---|---|---|
| JP | 4771714 B2 | 9/2011 |
| JP | 2014239050 A | 12/2014 |
| KR | 101154482 B1 | 6/2012 |

\* cited by examiner

*Primary Examiner* — Quoc Hoang
(74) *Attorney, Agent, or Firm* — Harness, Dickey & Pierce, PLC

(57) ABSTRACT

A reticle may be fabricated and inspected. The reticle, which may include thin patterns, may be selectively incorporated into a fabricated semiconductor device based on measurement information generated based on the inspecting. The inspecting may include forming thin patterns on a substrate, forming a first discharge layer on the thin patterns, and directing a first charged particle beam to the substrate, such that the first charged particle beam passes through the first discharge layer. Measurement information may be generated based on the first charged particle beam. The first discharge layer may connect the thin patterns to each other and may be separated from the substrate between the thin patterns.

18 Claims, 10 Drawing Sheets

PATTERN INSPECTION METHODS AND METHODS OF FABRICATING RETICLES USING THE SAME VIA DIRECTING CHARGED PARTICLE BEAMS THROUGH DISCHARGE LAYERS

CROSS-REFERENCE TO RELATED APPLICATIONS

This U.S. non-provisional patent application claims priority under 35 U.S.C. § 119 to Korean Patent Application No. 10-2016-0146376, filed on Nov. 4, 2016, in the Korean Intellectual Property Office, the entire contents of which are hereby incorporated by reference.

BACKGROUND

The present disclosure relates to fabricating reticles, and in particular, to pattern inspection methods of inspecting reticle patterns and methods of fabricating reticles using the same.

In general, a semiconductor device may be fabricated through a plurality of unit processes including a thin-film deposition process, a photolithography process, and an etching process. The photolithography process may be a significant process in fabricating a semiconductor device. A photolithography process may include an exposure process. A reticle may be used in an exposure system for performing the exposure process. The reticle may include metallic reticle patterns. Since a quality of the reticle patterns may affect a production yield of a semiconductor device, it is desirable to thoroughly inspect the quality of the reticle patterns.

SUMMARY

Some example embodiments of the inventive concepts provide a pattern inspection method capable of discharging electric charges from reticle patterns, which are charged by a charged particle beam, and a method of fabricating a reticle using the same.

Some example embodiments of the inventive concepts provide a pattern inspection method capable of limiting and/or preventing a charged particle beam from being deflected and a method of fabricating a reticle using the same.

According to some example embodiments of the inventive concepts, a pattern inspection method may include forming thin patterns on a substrate, forming a first discharge layer on the thin patterns, and directing a first charged particle beam to the substrate, such that the first charged particle beam passes through the first discharge layer, to measure the thin patterns. The first discharge layer may connect the thin patterns to each other. The first discharge layer may be isolated from the substrate by at least the thin patterns.

According to some example embodiments of the inventive concepts, a method of fabricating a reticle may include forming a metal layer on a substrate, forming a resist on the metal layer, forming an exposure discharge layer on the resist, directing a first charged particle beam to the substrate, such that the first charged particle beam passes through the exposure discharge layer to change a property of at least a portion of the resist, developing the resist to form resist patterns, etching the metal layer using the resist patterns as an etch mask to form reticle patterns, forming a first measurement discharge layer on the reticle patterns, and directing a second charged particle beam to the substrate, such that the second charged particle beam passes through the first measurement discharge layer to measure the reticle patterns.

According to some example embodiments, a method may include forming thin patterns on a substrate, forming a first discharge layer on the thin patterns, the first discharge layer connecting the thin patterns to each other, the first discharge layer isolated from the substrate by at least the thin patterns, generating measurement information associated with the thin patterns based on directing a first charged particle beam to the substrate, the measurement information indicating deformation, displacement, and/or critical dimension associated with the thin patterns, and selectively incorporating the thin patterns into a fabricated semiconductor device, based on a determination that the measurement information indicates that the deformation, displacement, and/or critical dimension associated with the thin patterns at least meets one or more threshold values.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown.

Figure 1:
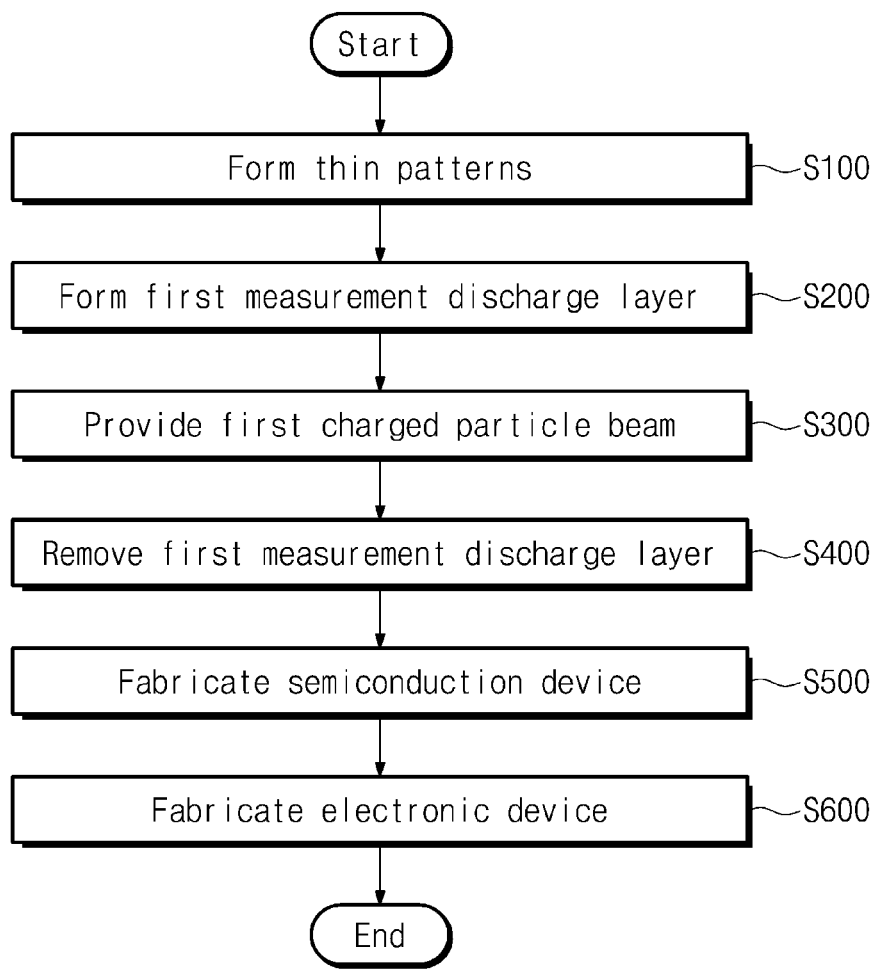
FIG. 1 is a flow chart illustrating method according to some example embodiments of the inventive concepts.

FIG. 1 illustrates a method according to some example embodiments of the inventive concepts.

Referring to FIG. 1, a pattern inspection method may be performed using an electron microscope. In some example embodiments, the pattern inspection method may be performed using an optical microscope. The pattern inspection method may include forming thin patterns (in S100), forming a first measurement discharge layer (in S200), providing a first charged particle beam (in S300), and removing the first measurement discharge layer (in S400). As shown in FIG. 1, a method may further include fabricating ("manufacturing") a semiconductor device using (e.g., "incorporating") at least the thin patterns 12 (in S500) and fabricating an electronic device to incorporate the semiconductor device (in S600). In some example embodiments, at least the thin patterns 12 are selectively incorporated into the semiconductor device (in S500), based on processing measurement data (also referred to herein as measurement information) generated based on the pattern inspection method.

Figure 2:
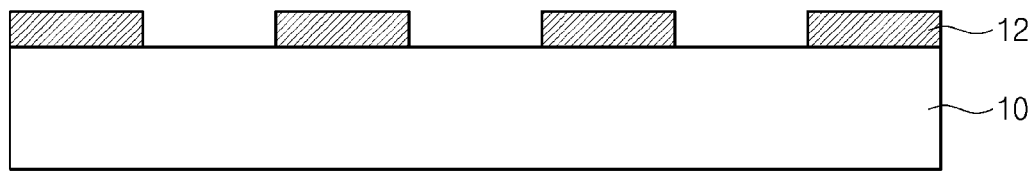
FIG. 2, FIG. 3, and FIG. 4 are sectional views illustrating the pattern inspection method of FIG. 1.
Figure 3:
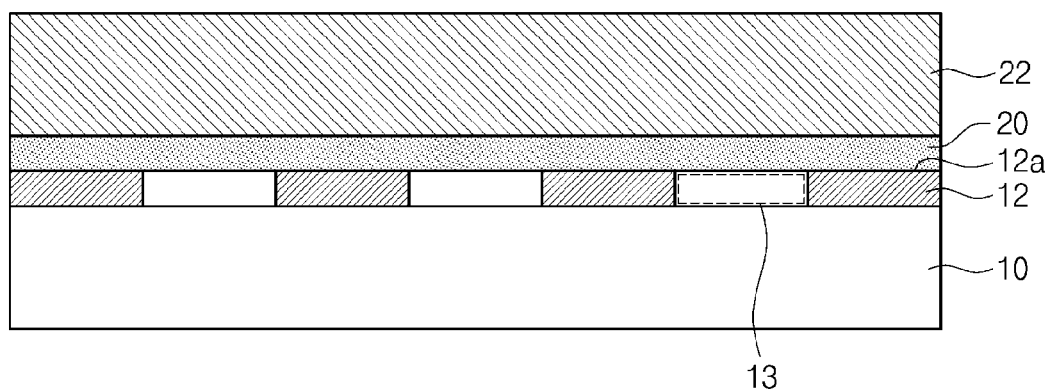
Figure 4:
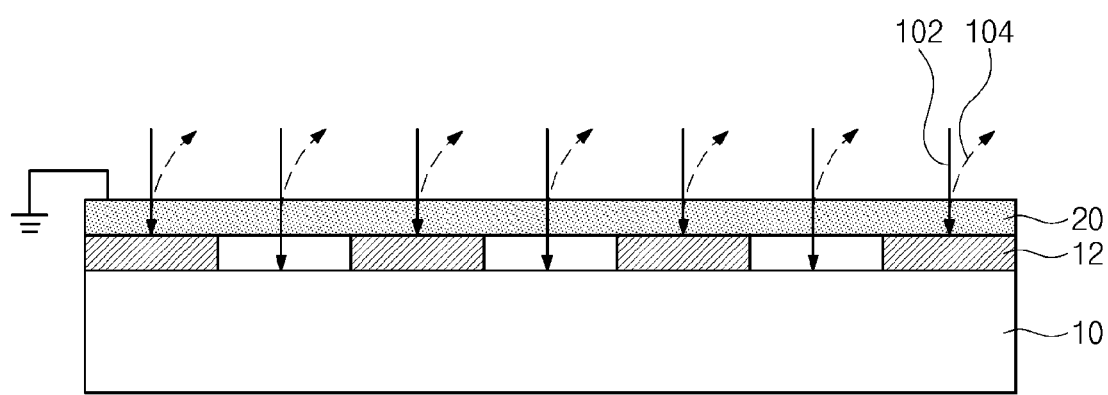

FIG. 2, FIG. 3, and FIG. 4 are sectional views illustrating the pattern inspection method of FIG. 1.

Referring to FIGS. 1 and 2, thin patterns 12 may be formed on a substrate 10 (in S100). In some example embodiments, the substrate 10 may include a transparent substrate. For example, the substrate 10 may be formed of or include (e.g., at least partially comprise) quartz, glass, or transparent plastic. In some example embodiments, the substrate 10 may include an opaque substrate. For example, the substrate 10 may be formed of or include opaque plastic, ceramics, silicon, gallium arsenide, gallium nitride, or a metal substrate. The thin patterns 12 may be reticle patterns and/or mask patterns. The thin patterns 12 may have a critical dimension ranging from 10 nm to 10 μm. The thin patterns 12 may include a metal layer. For example, a thin layer 14 for the thin patterns 12 may include chromium (Cr). In some example embodiments, the thin layer 14 may be formed of or include tungsten (W), aluminum (Al), copper (Cu), tantalum (Ta), titanium (Ti), or lead (Pb). In some example embodiments, the thin patterns 12 may be patterns included in a semiconductor device, such that the fabrication of a semiconductor device includes incorporating at least the thin patterns 12 as reticles into the fabricated semiconductor device. The thin patterns 12 may be selectively incorporated into the fabricated semiconductor device based on a determination that the thin patterns have a critical dimension that at least meets a particular threshold value. The thin patterns 12 may include silicon, silicon oxide, silicon nitride, silicon oxynitride, metal oxide, metal nitride, metal oxynitride, resist, inorganic material, or dye.

Referring to FIGS. 1 and 3, a first measurement discharge layer 20 may be formed on the thin patterns 12 (in S200). In some example embodiments, the first measurement discharge layer 20 may be formed by a transferring operation. For example, the first measurement discharge layer 20 may be transferred onto the thin patterns 12 using a first transfer substrate 22. The first measurement discharge layer 20 may be formed of or include graphene. The first transfer substrate 22 may include a roll-to-roll film or a tape film. In some example embodiments, the first measurement discharge layer 20 may be formed to be flat on (e.g., "in flush contact with") the thin patterns 12. The first measurement discharge layer 20 may extend along and parallel to the top surfaces 12a of the thin patterns 12. The first measurement discharge layer 20 may be formed to connect the thin patterns 12 in shortest distance to each other. The first measurement discharge layer 20 may be separated from portions of the substrate 10 between the thin patterns 12 (e.g., the first discharge layer 20 may be isolated from the substrate 10 by at least the thin patterns 12), such that a gap space 13 is between the substrate 10, adjacent thin patterns 12, and the first measurement discharge layer 20. The first measurement discharge layer 20 may have mobility of about 200,000 $cm^2$/Vs which is higher than those of typical metals. In some example embodiments, the first measurement discharge layer 20 may include carbide or a metal grid. For example, the first measurement discharge layer 20 may include carbon, graphite, fullerene, or carbon nanotube.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

Figure 5:
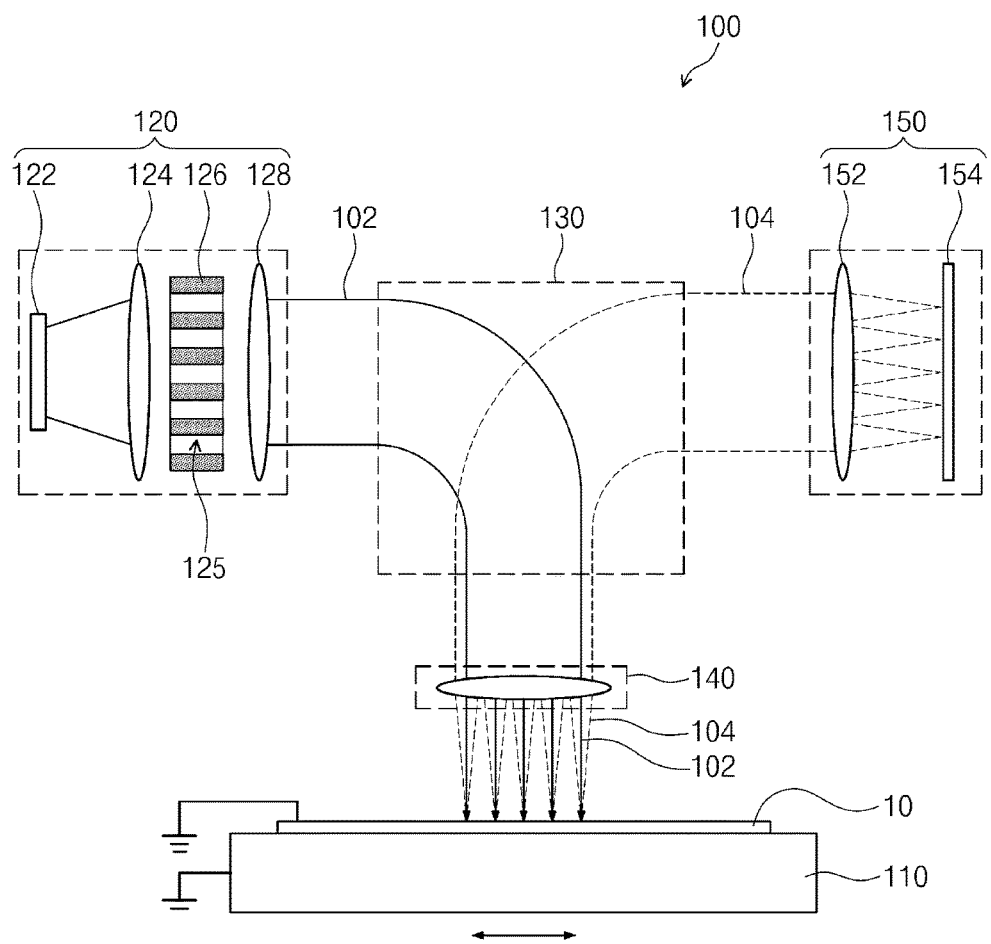
FIG. 5 is a schematic diagram illustrating a measurement system for measuring thin patterns of FIG. 3.

FIG. 5 is a schematic diagram illustrating a measurement system 100 configured to measure the thin patterns 12 of FIG. 3.

Referring to FIGS. 1, 4, and 5, the measurement system 100 may be configured to provide (e.g., "generate," "emit," and/or "direct") a first charged particle beam 102 onto the substrate 10 and to measure the thin patterns 12 using the first charged particle beam 102 (in S300). In some example embodiments, the measurement system 100 may include an electron microscope. In some example embodiments, the measurement system 100 may include an optical microscope. For example, the measurement system 100 may be used to obtain ("capture," "generate," etc.) images of the substrate 10 and the thin patterns 12. Furthermore, the measurement system 100 may be used to obtain information on a position of the thin pattern 12 in the image and on deformation, displacement, and/or critical dimension of the thin pattern 12 (also referred to herein as measurement information associated with the thin pattern 12). In some example embodiments, the fabricating of a semiconductor device (in S500) includes selectively incorporating the thin patterns 12 in the semiconductor device based on a determination, based on processing the above-noted measurement information obtained by the measurement system 100, of whether the deformation, displacement, and/or critical dimension of the thin pattern 12 at least meets one or more threshold values.

Figure 6:
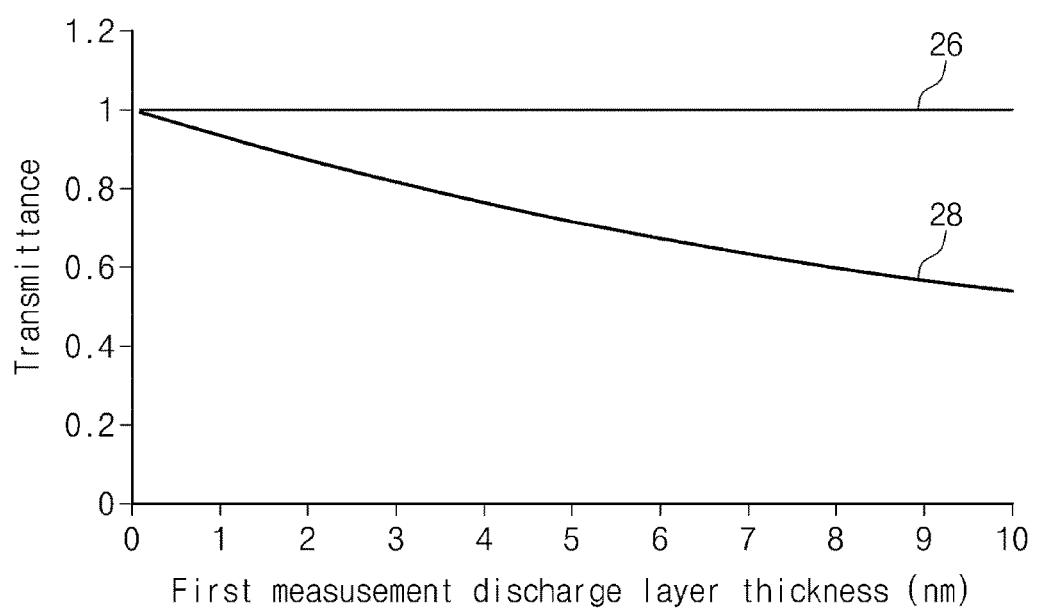
FIG. 6 is a graph showing changes in transmittance of a first charged particle beam and visible light, which result from a change in thickness of the first measurement discharge layer of FIG. 4.

FIG. 6 is a graph showing changes in transmittance of the first charged particle beam 102 and visible light, which result from a change in thickness of the first measurement discharge layer 20 of FIG. 4. The curves 26 and 28 of FIG. 6 represent the transmittance results that were obtained from the first charged particle beam 102 and the visible light, respectively.

As shown in FIG. 6, the increase in thickness of the first measurement discharge layer 20 did not cause a change in the transmittance 26 of the first charged particle beam 102. By contrast, the transmittance 28 of the visible light was decreased. The transmittance 28 of the visible light was inversely proportional to the thickness of the first measurement discharge layer 20. For example, when the first measurement discharge layer 20 had a thickness of 10 nm or less, the transmittance 28 of the visible light was decreased from 1 to 0.55. When the first measurement discharge layer 20 had a thickness of 10 nm or less, the transmittance 26 of the first charged particle beam 102 was about 1. This means that most of the first charged particle beam 102 passes through the first measurement discharge layer 20.

Referring back to FIG. 5, in the case where the substrate 10 and the thin patterns 12 are irradiated with the first charged particle beam 102, secondary electrons 104 may be generated from the substrate 10 and the thin patterns 12. The measurement system 100 may be configured to detect the secondary electrons 104 and to produce ("generate," "capture," etc.) an image of the substrate 10 and the thin patterns 12 based on the detected secondary electrons 104. In some example embodiments, the measurement system 100 may include a first stage 110, a first beam source 120, a beam splitter 130, an objective 140, and a detector 150.

The first stage 110 may be configured to load the substrate 10 thereon. The first stage 110 may also be configured to move the substrate 10 in a horizontal direction. The first stage 110 may be grounded.

The first beam source 120 may be provided at a side of the beam splitter 130. The first beam source 120 may provide (e.g., "generate," "emit," and/or "direct") the first charged particle beam 102 to the beam splitter 130 and the objective 140. In some example embodiments, the first beam source 120 may include a beam generator 122, a beam collimator 124, a porous plate 126, and a source field lens 128. The beam generator 122 may be used to generate the first charged particle beam 102. The beam collimator 124 may be configured to enable a parallel propagation of the first charged particle beam 102. The porous plate 126 may be configured to remove a portion of the first charged particle beam 102. For example, the first charged particle beam 102 may pass through holes 125 that are located in the porous plate 126. The porous plate 126 may be configured to thus provide a first charged particle beam 102 that includes multiple discrete beams, or "multi-spots." The multi-spots of the first charged particle beam 102 may be a beam "bundle." The source field lens 128 may be configured to provide (e.g., "direct") the first charged particle beam 102 toward the beam splitter 130.

The beam splitter 130 may be between the first beam source 120 and the first stage 110. The beam splitter 130 may be configured to change a propagation direction of the first charged particle beam 102 towards the objective 140. The beam splitter 130 may also be configured to change a propagation direction of the secondary electrons 104.

The objective 140 may be between the beam splitter 130 and the first stage 110. The objective 140 may be configured to provide (e.g., "direct") the first charged particle beam 102 to the substrate 10 on the first stage 110. The objective 140 may be configured to provide ("direct" 0 the secondary electrons 104 to the beam splitter 130 and the detector 150.

The first charged particle beam 102 may be provided in the form of multi-spots, e.g., a pattern of beam spots corresponding to the holes 125 of the porous plate 126. The first charged particle beam 102 may be provided to the substrate 10 and the thin patterns 12. Electric charges and/or charged particles associated with the first charged particle beam 102 may accumulated in the substrate 10 and the thin patterns 12 based on the first charged particle beam being directed to ("irradiated on") the substrate 10 and the thin patterns 12. The substrate 10 and the thin patterns 12 may be charged by the electric charges associated with the first charged particle beam 102. For example, if and/or when the first charged particle beam 102 is an electron beam, the substrate 10 and the thin patterns 12 may be negatively charged based on the first charged particle beam 102 being irradiated on the substrate 10 and the thin patterns 12. In some example embodiments, the substrate 10 and the thin patterns 12 may be positively charged. In the case where the substrate 10 or the thin patterns 12 is electrically charged, a propagation direction of the first charged particle beam 102 may be distorted. That is, the first charged particle beam 102 may be deflected. In some example embodiments, the first stage 110 may be configured to enable the substrate 10 to be grounded (e.g., the first stage 110 may ground the substrate 10). The first measurement discharge layer 20 may be configured to allow the thin patterns 12 to be grounded (e.g., the first measurement discharge layer 20 may ground the thin patterns 12). By using the first measurement discharge layer 20, it may be possible to more quickly discharge the charged thin patterns 12, compared to the substrate 10 or a typical metal. The first charged particle beam 102 may be provided to the thin patterns 12 regardless of the substrate 10 and the thin patterns 12 which are discharged. Thus, deflection of the first charged particle beam 102 may be reduced and/or prevented, thereby enabling the improvement of accuracy and/or precision of measurement information and/or images generated based on the secondary electrons 104. As a result, the accuracy and/or precision of the determination of whether to selectively incorporate thin patterns into a semiconductor device, based on a determination that the measurement information includes information that at least meets a threshold value, may be improved, thereby enabling the improvement of the reliability and/or performance of fabricated semiconductor devices and/or electronic devices in which the semiconductor devices may be incorporated.

If and/or when the first charged particle beam 102 is directed to the substrate 10 and thin patterns 12, the substrate 10 and the thin patterns 12 may emit the secondary electrons 104 based on such directing. An emission amount of the secondary electrons 104 of the thin patterns 12 (e.g., amount of secondary electrons 104 emitted from the thin patterns 12) may be different from that of the secondary electrons 104 of the substrate 10 (e.g., amount of secondary electrons 104 emitted from the substrate 10). For example, the emission amount of the secondary electrons 104 may be abruptly changed at corners and/or sidewalls of the thin patterns 12. This may be because electric charges of the thin patterns 12 are concentrated near corners of the thin patterns 12. The secondary electrons 104 may be provided (e.g., emitted) in the form of a beam bundle. The secondary electrons 104 may be provided (e.g., directed) to the detector 150 through the objective 140 and the beam splitter 130.

In some example embodiments, the detector 150 may be at an opposite side of the beam splitter 130, relative to the first beam source 120, to face the first beam source 120. The detector 150 may be configured to receive the secondary electrons 104 directed from the beam splitter 130. The detector 150 may be configured to detect the secondary electrons 104. For example, the detector 150 may include a projection lens 152 and a sensor 154. The projection lens 152 may be configured to transfer the secondary electrons 104 to the sensor 154. The sensor 154 may be or include a CCD or CMOS image sensor. The sensor 154 may provide (e.g., "generate," "emit," and/or "transmit") a sensing signal associated with the secondary electrons 104 to a controller (not shown). If the substrate 10 is moved by the first stage 110, the sensor 154 may continuously output the sensing signal associated with the secondary electrons 104 emitted by at least the substrate 10 and thin patterns 12 (also referred to herein as the sensing signal of the substrate 10). The sensing signal of the substrate 10 output from the sensor 154 may indicate an intensity associated with different portions of the substrate 10 and thin patterns 12. The sensing signal of the substrate 10 may have an increased and/or maximum intensity associated with the corners or the boundary of the thin patterns 12. The controller may obtain (e.g., capture, generate, transmit, etc.) an image of the substrate 10 and the thin patterns 12 based on the sensing signal. The image may be obtained to show a boundary of each of the thin patterns 12.

Referring to FIGS. 1 and 2, the first measurement discharge layer 20 may be removed (in S400). In some example embodiments, the first measurement discharge layer 20 may be etched by a dry etching process. For example, the first measurement discharge layer 20 may be removed by an etching method using oxygen and/or ozone plasma.

Figure 7:
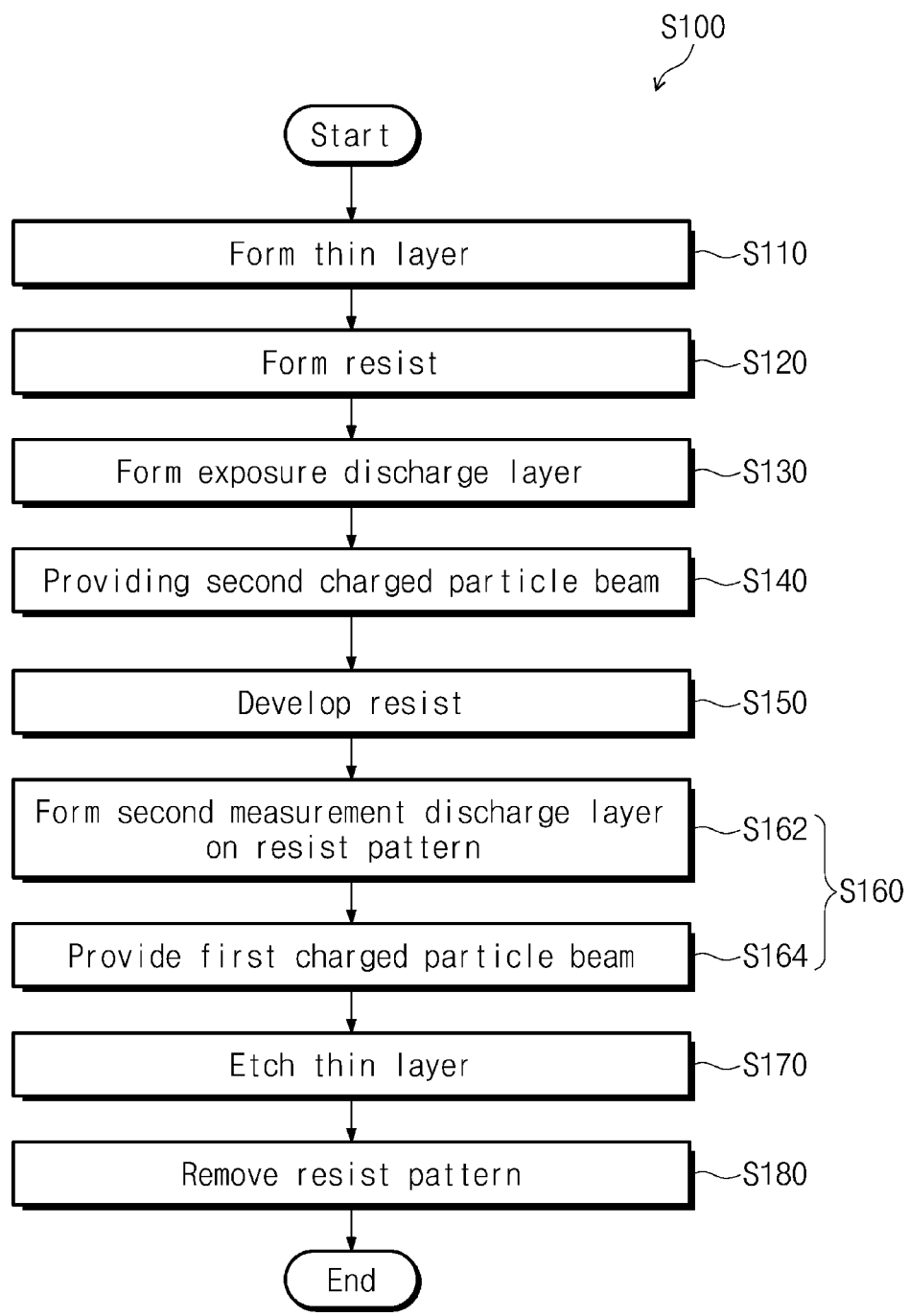
FIG. 7 is a flow chart illustrating an example of a step of forming the thin patterns of FIG. 1.

FIG. 7 is a flow chart illustrating an example of the step S100 of forming the thin patterns 12 of FIG. 1.

Referring to FIG. 7, the step S100 of forming the thin patterns 12 may be used to fabricate a reticle. The reticle may be selectively incorporated into a fabricated semiconductor device. In some example embodiments, the step S100 of forming the thin patterns 12 may be used to fabricate a semiconductor device or a display device. In some example embodiments, the step S100 of forming the thin patterns 12 may include steps of forming a thin layer (in S110), forming a resist (in S120), forming an exposure discharge layer (in S130), providing a second charged particle beam (in S140), developing the resist (in S150), inspecting resist patterns (in S160), etching the thin layer (in S170), and removing the resist patterns (in S180).

FIG. 8, FIG. 9, FIG. 10, FIG. 11, FIG. 12, FIG. 13, FIG. 14, and FIG. 15 are sectional views illustrating a step of forming the thin patterns of FIG. 7.

Figure 8:
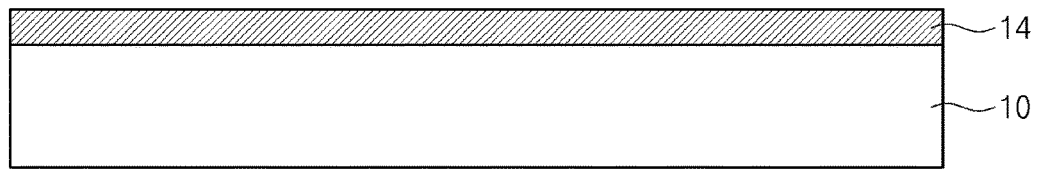
FIG. 8, FIG. 9, FIG. 10, FIG. 11, FIG. 12, FIG. 13, FIG. 14, and FIG. 15 are sectional views illustrating a step of forming the thin patterns of FIG. 7.

Referring to FIGS. 7 and 8, the thin layer 14 may be formed on the substrate 10 (in S110). For example, the thin layer 14 may be formed based on a physical vapor deposition or a chemical vapor deposition. The thin layer 14 may be formed of or include at least one of metal, organic, inorganic, or dielectric materials. The thin layer 14 may include chromium.

Figure 9:
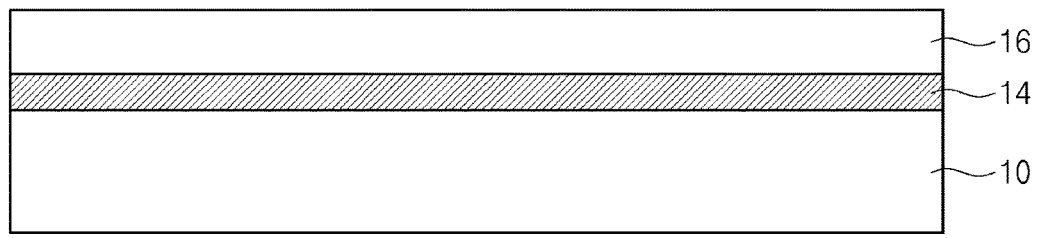

Referring to FIGS. 7 and 9, a resist 16 may be formed on the thin layer 14 (in S120). For example, the resist 16 may be formed by a spin coating method. The resist 16 may be a photoresist. The resist 16 may be formed of or include a material containing a benzene chain.

Figure 10:
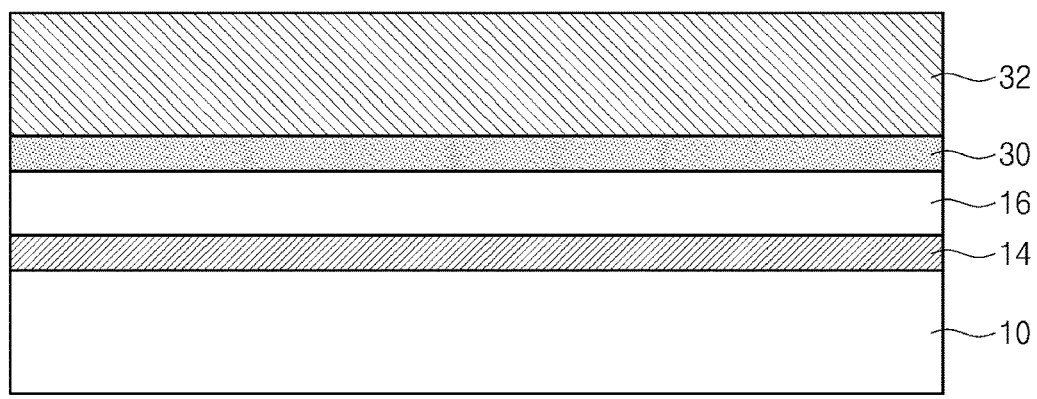

Referring to FIGS. 7 and 10, an exposure discharge layer 30 may be formed on the resist 16 (in S130). In some example embodiments, the exposure discharge layer 30 may be formed by a transferring operation. The exposure discharge layer 30 may be flat (e.g., planar or substantially planar). The exposure discharge layer 30 may be transferred from a second transfer substrate 32 to the resist 16. For example, the exposure discharge layer 30 may be formed of or include graphene. In some example embodiments, the exposure discharge layer 30 may include carbon, graphite, fullerene, or carbon nanotube. The exposure discharge layer 30 may include a metal grid. The second transfer substrate 32 may include a roll-to-roll film or a tape film.

Figure 11:
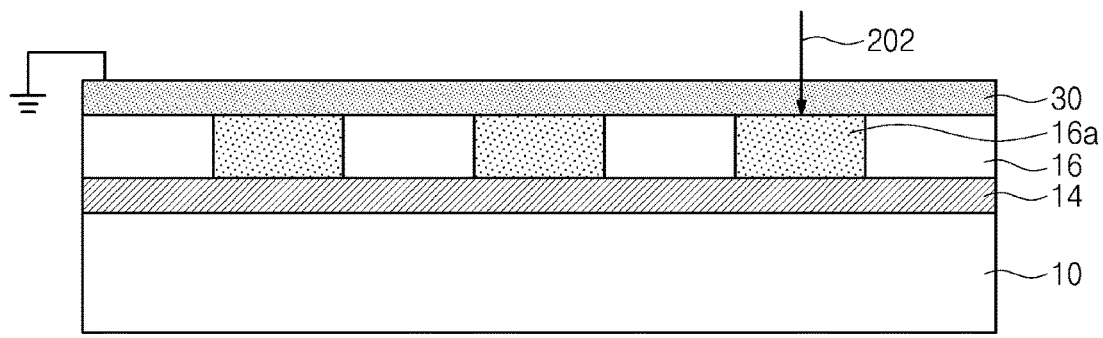

Referring to FIGS. 7 and 11, a second charged particle beam 202 may be provided (e.g., "directed") to the resist 16 to change properties of at least a portion of the resist 16 (in S140). For example, the second charged particle beam 202 may include an electron beam. The second charged particle beam 202 may be provided in the form of a single spot to be incident into a particular portion of the resist 16. The second charged particle beam 202 may pass through the exposure discharge layer 30. A portion 16a of the resist 16 may be exposed by the second charged particle beam 202. If and/or when the resist 16 includes benzene chains, the second charged particle beam 202 may cut the benzene chains in the exposed portion 16a of the resist 16.

Figure 16:
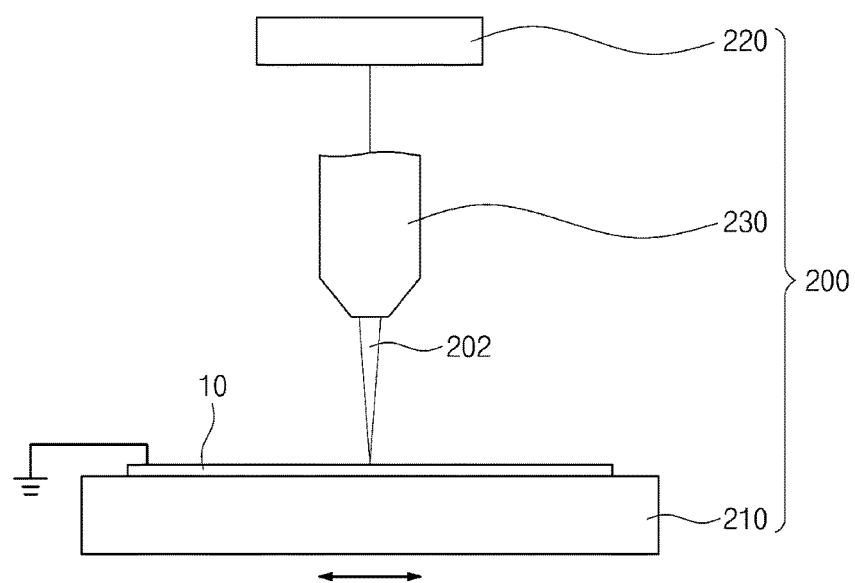
FIG. 16 is a schematic diagram illustrating an example of an exposure system configured to provide a second charged particle beam of FIG. 11.

FIG. 16 is a schematic diagram illustrating an exposure system 200, which is configured to provide the second charged particle beam 202 of FIG. 11.

Referring to FIG. 16, the exposure system 200 may include an electron beam exposure system. In some example embodiments, the exposure system 200 may include a second stage 210, a second beam source 220, and an e-beam gun 230. The second stage 210 may be configured to load the substrate 10 thereon. The second stage 210 may be grounded. The substrate 10 may be grounded through the second stage 210. The second beam source 220 may be configured to generate ("emit") the second charged particle beam 202. The e-beam gun 230 may be configured to irradiate ("direct") the second charged particle beam 202 onto the substrate 10 in the form of a single spot beam. The second stage 210 may move the substrate 10 in accordance with a particular (or, alternatively predetermined) map ("pattern") (not shown). The second charged particle beam 202 may be directed to the resist 16 in accordance with the map. Nevertheless, a portion of the resist 16 may be charged by the second charged particle beam 202.

Referring to FIG. 11, the exposure discharge layer 30 may be used to discharge the charged portion 16a of the resist 16. The exposure discharge layer 30 may be configured to more quickly discharge the resist 16, compared to the substrate 10. The second charged particle beam 202 may be directed to the substrate 10, without a deflection issue caused by the charged portion 16a of the resist 16.

Figure 12:
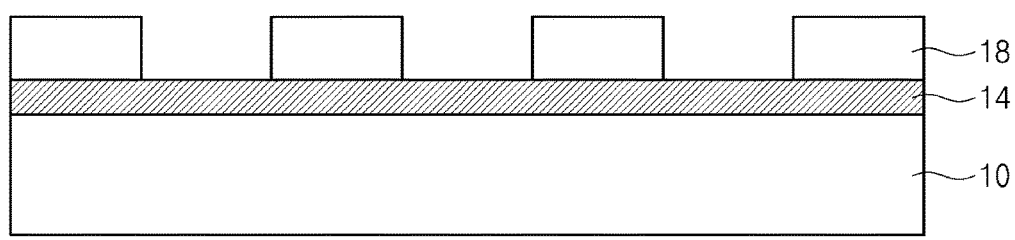

Referring to FIGS. 7 and 12, the resist 16 may be developed to form resist patterns 18 (in S150). In some example embodiments, the exposed portion 16a of the resist 16 may be removed by an aqueous developing solution (not shown). For example, the developing solution may remove the exposure discharge layer 30, along with the exposed portion 16a of the resist 16.

Referring to FIGS. 5 and 7, the measurement system 100 may measure the resist patterns 18 (in S160). For example, the measurement system 100 may be configured to obtain an image of the resist patterns 18. The measurement system 100 may be used to obtain information on position, deformation, displacement, or critical dimension of the resist pattern 18. For example, the resist patterns 18 may have a critical dimension ranging from 10 nm to 10 μm. In some example embodiments, the step S160 of measuring the resist patterns 18 may include forming a second measurement discharge layer 40 (in S162) and providing ("directing") the first charged particle beam 102 to the resist patterns 18 (in S164).

Figure 13:
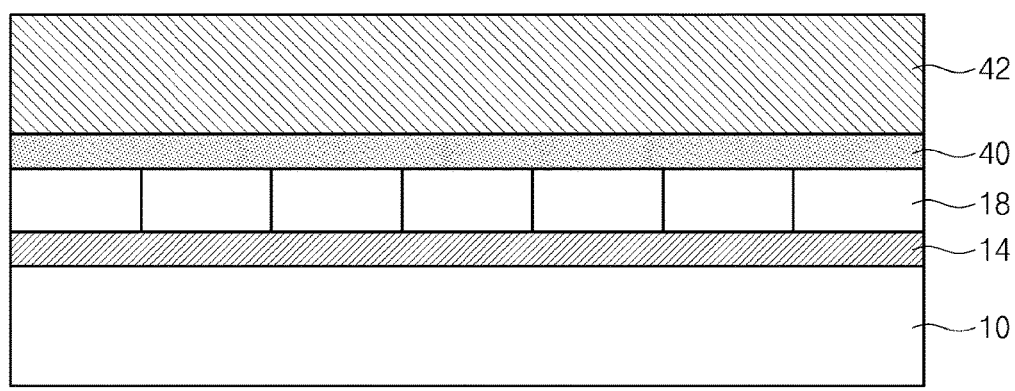

Referring to FIGS. 7 and 13, the second measurement discharge layer 40 may be formed on the resist patterns 18 (in S162). In some example embodiments, the step S162 of forming the second measurement discharge layer 40 may be substantially the same as the step S200 of forming the first measurement discharge layer 20 described with reference to FIG. 1. For example, the second measurement discharge layer 40 may be formed by a transferring operation. The second measurement discharge layer 40 may be formed of or include graphene. The second measurement discharge layer 40 may be transferred to the resist patterns 18 from a third transfer substrate 42. The third transfer substrate 42 may include a roll-to-roll film or a tape film. The second measurement discharge layer 40 may be flat. The second measurement discharge layer 40 may connect the resist patterns 18 to each other. The second measurement discharge layer 40 may be separated from the thin layer 14.

Figure 14:
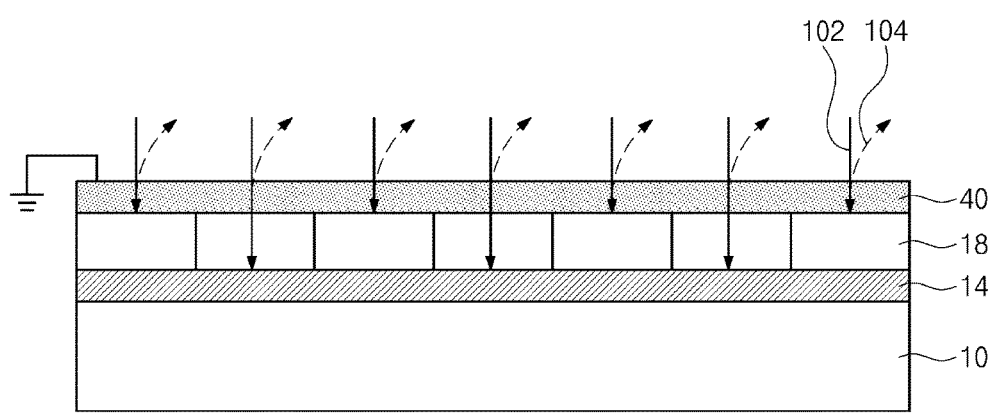

Referring to FIGS. 5, 7, and 14, the measurement system 100 may be configured to direct the first charged particle beam 102 to the resist patterns 18 and to obtain an image of the resist patterns 18 based on the first charged particle beam 102 (in S164). In some example embodiments, the step S164 of providing the first charged particle beam 102 may be substantially the same as the step S300 of providing the first charged particle beam 102 described with reference to FIG. 1. The first charged particle beam 102 may be provided to pass through the second measurement discharge layer 40. The first charged particle beam 102 may be absorbed in the resist patterns 18 and the thin layer 14. The resist patterns 18 and the thin layer 14 may emit the secondary electrons 104 based on the first charged particle beam 102 being absorbed in the resist patterns 18 and the thin layer 14. An emission amount of the secondary electrons 104 of the resist patterns 18 may be different from that of the secondary electrons 104 of the thin layer 14. For example, the emission amount of the secondary electrons 104 may be abruptly changed at corners and/or sidewalls of the resist patterns 18. Accordingly, the measurement system 100 may obtain an image corresponding to a boundary between the resist patterns 18 and the thin layer 14. The measurement system 100 may be configured to obtain information on a position, deformation, displacement, and/or critical dimension of the resist pattern 18 (also referred to herein as measurement information associated with the resist pattern 18) from the image.

Figure 15:
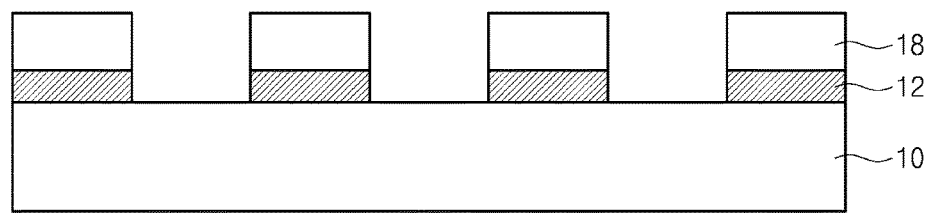

Referring to FIGS. 7 and 15, the second measurement discharge layer 40 and the thin layer 14 may be etched to form the thin patterns 12 (in S170). In some example embodiments, the second measurement discharge layer 40 and the thin layer 14 may be etched at the same time by a dry etching process. For example, the dry etching process on the second measurement discharge layer 40 and the thin layer 14 may be performed in an in-situ manner. The second measurement discharge layer 40 may be removed by an etching method using oxygen and/or ozone plasma. The thin layer 14 may be removed by an etching method using plasma of acid and/or ammonia gas. The acid gas may include chlorine gas or methane gas. The resist patterns 18 may be used as an etch mask for etching the thin layer 14.

Referring to FIGS. 2 and 7, the resist patterns 18 may be removed (in S180). The resist patterns 18 may be removed in a dry or wet manner. For example, the resist patterns 18 may be removed in a dry manner using an ashing gas. In some example embodiments, the resist patterns 18 may be removed in a wet manner using an organic solvent.

According to some example embodiments of the inventive concepts, a pattern inspection method may include forming a discharge layer and providing a charged particle beam. The discharge layer may be formed on reticle patterns and may be grounded. The discharge layer may include graphene whose mobility is higher than those of metals. The charged particle beam may pass through the discharge layer. The discharge layer may be configured to more quickly discharge the reticle patterns, which may be charged by the charged particle beam, compared to the metals. In the case where the reticle patterns are discharged, it is possible to reduce and/or prevent deflection of a first charged particle beam.

Figure 17:
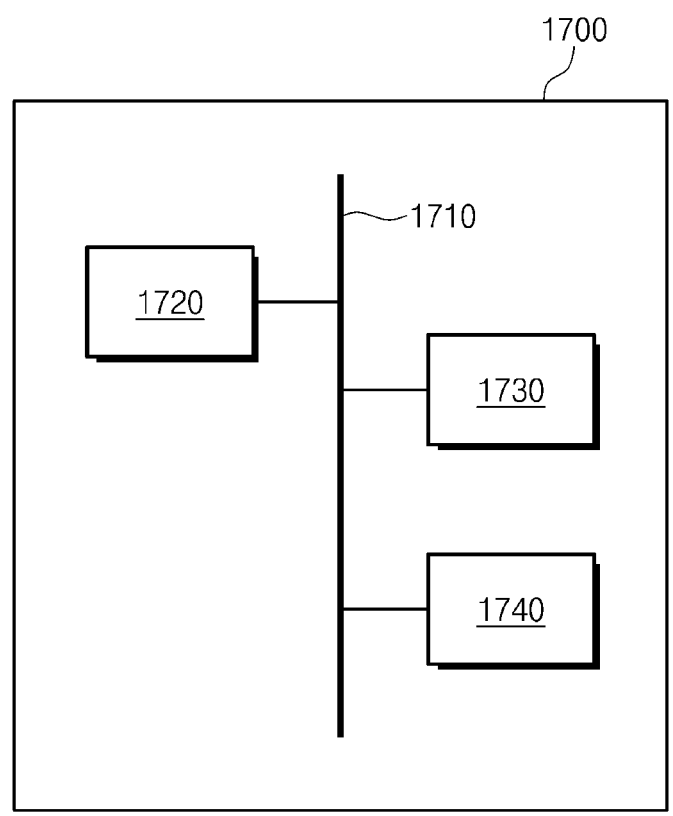
FIG. 17 is a diagram illustrating an electronic device according to some example embodiments.

FIG. 17 is a diagram illustrating an electronic device 1700 according to some example embodiments.

Referring to FIG. 17, the electronic device 1700 includes a memory 1720, a processor 1730, and a communication interface 1740.

The electronic device 1700 may be included in one or more various electronic devices. In some example embodiments, the electronic device 1700 may include a computing device. A computing device may include a personal computer (PC), a tablet computer, a laptop computer, a netbook, some combination thereof, or the like. The memory 1720, the processor 1730, and the communication interface 1740 may communicate with one another through a bus 1710.

In some example embodiments, the electronic device 1700 may be fabricated at S600 in FIG. 1. In some example embodiments, the memory 1720 and/or the processor 1730 may include one or more semiconductor devices that may be fabricated at S500 in FIG. 1. Thus, the memory 1720 and/or processor 1730 may include one or more sets of reticles that include the thin patterns 12 as described herein.

The communication interface 1740 may communicate data from an external device using various Internet protocols. The external device may include, for example, a computing device.

The processor 1730 may execute a program and control the electronic device 1700. A program code to be executed by the processor 1730 may be stored in the memory 1720. An electronic system may be connected to an external device through an input/output device (not shown) and exchange data with the external device.

The memory 1720 may store information. The memory 1720 may be a volatile or a nonvolatile memory. The memory may be a magnetic memory device (e.g., an MRAM). The memory 1720 may be a non-transitory computer readable storage medium. The memory may store computer-readable instructions that, when executed, cause the execution of one or more methods, functions, processes, etc. as described herein. In some example embodiments, the processor 1730 may execute one or more of the computer-readable instructions stored at the memory 1720.

In some example embodiments, the communication interface 1740 may include a USB and/or HDMI interface. In some example embodiments, the communication interface 1850 may include a wireless communication interface.

In some example embodiments, the electronic device 1700 may at least partially comprise the controller 402 illustrated and described with reference to FIG. 1. As such, the electronic device 1700, in some example embodiments, may be configured to perform any of the manufacturing methods that may be controlled by the controller 402.

In some example embodiments, an electronic device 1700 may be configured to implement some or all of the operations described and illustrated herein. For example, in some example embodiments, the electronic device 1700 may be configured to control the measurement system 100, system 200, some combination thereof, or the like. In some example embodiments, the electronic device 1700 may be configured to at least partially fabricate a semiconductor device and/or electronic device based on processing measurement information generated by measurement system 100.

While example embodiments of the inventive concepts have been particularly shown and described, it will be understood by one of ordinary skill in the art that variations in form and detail may be made therein without departing from the spirit and scope of the attached claims.

What is claimed is:
1. A pattern inspection method, comprising:
 forming thin patterns on a substrate;
  forming a first discharge layer on the thin patterns, the first discharge layer connecting the thin patterns to each other, the first discharge layer isolated from the substrate by at least the thin patterns; and
  directing a first charged particle beam to the substrate, such that the first charged particle beam passes through the first discharge layer, to measure the thin patterns, wherein the first discharge layer is formed based on a transferring operation.

2. The method of claim 1, wherein the first discharge layer includes graphene.

3. The method of claim 1, wherein the forming the thin patterns includes
forming a thin layer on the substrate,
forming a resist on the thin layer,
forming a second discharge layer on the resist, and
directing a second charged particle beam to the substrate, such that the second charged particle beam passes through the second discharge layer to change a property of at least a portion of the resist.

4. The method of claim 3, wherein the second discharge layer includes graphene formed based on a transferring operation.

5. The method of claim 3, wherein,
the forming the thin patterns includes developing the resist using a developing solution to form resist patterns, such that the second discharge layer is removed by the developing solution.

6. The method of claim 5, wherein,
the forming the thin patterns includes measuring the resist patterns,
the measuring of the resist patterns includes
forming a third discharge layer on the resist patterns, and
directing a third charged particle beam to the substrate, such that the third charged particle beam passes through the third discharge layer.

7. The method of claim 6, wherein the third discharge layer includes graphene formed based on a transferring operation.

8. The method of claim 6, wherein,
the forming the thin patterns includes etching the thin layer using the resist patterns as an etch mask, and
the third discharge layer and the thin layer are etched concurrently.

9. The method of claim 1, further comprising:
removing the first discharge layer, using oxygen or ozone plasma.

10. A method of fabricating a reticle, comprising:
forming a metal layer on a substrate;
forming a resist on the metal layer;
forming an exposure discharge layer on the resist;
directing a first charged particle beam to the substrate, such that the first charged particle beam passes through the exposure discharge layer to change a property of at least a portion of the resist;
developing the resist to form resist patterns;
etching the metal layer using the resist patterns as an etch mask to form reticle patterns;
forming a first measurement discharge layer on the reticle patterns; and
directing a second charged particle beam to the substrate, such that the second charged particle beam passes through the first measurement discharge layer to measure the reticle patterns.

11. The method of claim 10, wherein the first measurement discharge layer includes graphene formed based on a transferring operation.

12. The method of claim 10, wherein the first measurement discharge layer is configured to connect the reticle patterns to each other and is separated from the metal layer between the reticle patterns.

13. The method of claim 10, further comprising:
forming a second measurement discharge layer on the resist patterns; and
directing a third charged particle beam to the substrate, the third charged particle beam passing through the second measurement discharge layer, to measure the resist patterns.

14. The method of claim 13, wherein the second measurement discharge layer is configured to connect the resist patterns to each other and is separated from the metal layer between the resist patterns.

15. A method, comprising:
forming thin patterns on a substrate;
forming a first discharge layer on the thin patterns, the first discharge layer connecting the thin patterns to each other, the first discharge layer isolated from the substrate by at least the thin patterns;
directing a first charged particle beam to the substrate, such that the first charged particle beam passes through the first discharge layer, to generate measurement information indicating deformation, displacement, and/or a critical dimension associated with the thin patterns; and
selectively incorporating the thin patterns into a fabricated semiconductor device, based on a determination that the measurement information indicates that the deformation, displacement, and/or critical dimension associated with the thin patterns at least meets one or more threshold values,
wherein the forming the thin patterns includes
forming a thin layer on the substrate,
forming a resist on the thin layer,
forming a second discharge layer on the resist, and
directing a second charged particle beam to the substrate, such that the second charged particle beam passes through the second discharge layer to change a property of at least a portion of the resist.

16. The method of claim 15, wherein,
the forming the thin patterns includes developing the resist using a developing solution to form resist patterns, such that the second discharge layer is removed by the developing solution.

17. The method of claim 16, wherein,
the forming the thin patterns includes measuring the resist patterns,
the measuring of the resist patterns includes
forming a third discharge layer on the resist patterns, and
directing a third charged particle beam to the substrate, such that the third charged particle beam passes through the third discharge layer.

18. The method of claim 15, further comprising:
fabricating an electronic device that incorporates the fabricated semiconductor device.

* * * * *